United States Patent
Togami et al.

[11] Patent Number: 5,855,059
[45] Date of Patent: Jan. 5, 1999

[54] SURFACE MOUNTER

[75] Inventors: Tsuneji Togami; Yoshihisa Iwatsuke, both of Iwata, Japan

[73] Assignee: Yamaha Hatsudoki Kabushiki Kaisha, Iwata, Japan

[21] Appl. No.: 720,894

[22] Filed: Oct. 3, 1996

[30] Foreign Application Priority Data

Oct. 4, 1995 [JP] Japan .................................. 7-257924

[51] Int. Cl.⁶ ........................ H05K 3/30; H05K 13/02; H05K 13/04
[52] U.S. Cl. ................ 29/740; 29/743; 29/786; 29/794; 294/64.1; 414/737; 414/752
[58] Field of Search ............................ 29/712, 714, 740, 29/741, 743, 786, 793, 794; 198/346.1, 346.2; 294/64.1; 414/737, 752

[56] References Cited

U.S. PATENT DOCUMENTS

| | | | |
|---|---|---|---|
| 4,459,743 | 7/1984 | Watanabe et al. | 29/740 |
| 4,624,050 | 11/1986 | Hawkswell | 29/740 |
| 4,631,812 | 12/1986 | Young | 29/714 |
| 5,203,061 | 4/1993 | Hamada | 29/33 M |
| 5,208,969 | 5/1993 | Hidese | 29/740 |
| 5,342,460 | 8/1994 | Hidese | 29/741 X |
| 5,452,509 | 9/1995 | Suzuki et al. | 29/743 X |
| 5,724,722 | 3/1998 | Hashimoto | 29/740 |
| 5,743,001 | 4/1998 | Baker et al. | 294/64.1 X |
| 5,743,005 | 4/1998 | Nakao et al. | 29/743 X |

FOREIGN PATENT DOCUMENTS

| | | | |
|---|---|---|---|
| 5267896 | 10/1993 | Japan | 29/740 |
| 2173426 | 10/1986 | United Kingdom | 29/740 |

OTHER PUBLICATIONS

European Search Report dated Apr. 14, 1998.
Patent Abstracts of Japan, vol. 95, No. 8, 29 Sep. 1995 & JP 07 124824 A.
Patent Abstracts of Japan, vol. 95, No. 4, 31 May 95 & JP 07 030292 A.
Patent Abstracts of Japan, vol. 16, No. 271 (E–1218), 18 Jun. 1992 & JP 04 064283 A.

*Primary Examiner*—Peter Vo
*Attorney, Agent, or Firm*—Knobbe, Martens, Olson & Bear LLP

[57] ABSTRACT

A surface mounter device including a carriage assembly having a pair of mounter heads mounted on opposite sides of the carriage assembly. Each mounter head is adapted to pick up components from a respective feeder station at a respective side conveyor that delivers substrates to the mounting area. A translational conveyor mechanism is provided for transversely moving the substrates relative to their path of movement by the conveyor so that components may be positioned on the substrate by one mounting head while the other mounting head is picking up components from its respective feeder station.

13 Claims, 5 Drawing Sheets

SURFACE MOUNTER

BACKGROUND OF THE INVENTION

This invention relates to a surface mounter and more particularly to an improved high-speed, high-capability mounter for mounting components on substrates.

A wide variety of types of apparatus have been proposed for mounting small components such as electrical components like resistors, capacitors or integrated circuits on a substrate such as a printed circuit board. Basically, these types of apparatus operate by conveying the circuit boards along a conveyor in a first path. The circuit boards are presented to a mounting station and component feeder sections are disposed on at least one side of the conveyor and from which components are selected by a mounter head. The mounter head then places the components on the printed circuit board.

In an effort to increase the production capabilities and speed of this type of equipment, it has been proposed to provide mounting heads that have a number of pickup devices mounted on them. In addition, it has been proposed, for example in U.S. Pat. No. 5,002,448, entitled "Circuit Board Assembling Device," and assigned to the assignee hereof to provide a pair of carriages which are capable of moving back and forth in a range to pickup components from feeders at either side of the conveyor and place them on the same circuit board.

This type of apparatus significantly increases the speed at which components can be mounted. However, and as is noted in U.S. Pat. No. 5,002,448, it must be ensured that the individual carriages that carry the mounting heads can move through their path without interfering with each other. This requires at times a sophisticated control in order to assure against collision between the carriages. Furthermore, this type of apparatus generally requires one carriage to be inoperative during at least a portion of the operation of the other carriage and its mounter head. These factors obviously add to the cost of the equipment and reduces its productivity.

It is, therefore, a principal object of this invention to provide an improved surface mounter having high speed and high flexibility.

It is a further object of this invention to provide an improved surface mounter that will permit the use of two mounting heads and each of which can perform operations without interference from the other.

SUMMARY OF THE INVENTION

This invention is adapted to be embodied in a surface mounting apparatus for mounting components on a substrate. The mounting apparatus is comprised of a conveyor section for transferring substrates along a path that extends generally in a first direction. A pair of feeder stations are provided for supplying a plurality of components for mounting on the substrate. The feeder stations are disposed on opposite sides of the conveyor path. A carriage assembly extends generally in the first direction along the path and between the feeder sections. The carriage assembly carries a pair of mounting heads on opposite sides thereof. Each of the mounting heads includes at least one pickup device for picking up a component from the feeder station at the respective side of the conveyor section. The mounter heads are supported for movement relative to each other and to the carriage assembly in the first direction. Transfer means are provided for moving a substrate transversely to the path of the conveyor section so that components may be placed on the substrate by one of the mounting heads when other components are being picked up from the respective feeder station by the other of the mounting heads.

DETAILED DESCRIPTION OF THE PREFERRED EMBODIMENTS OF THE INVENTION

Figure 1:
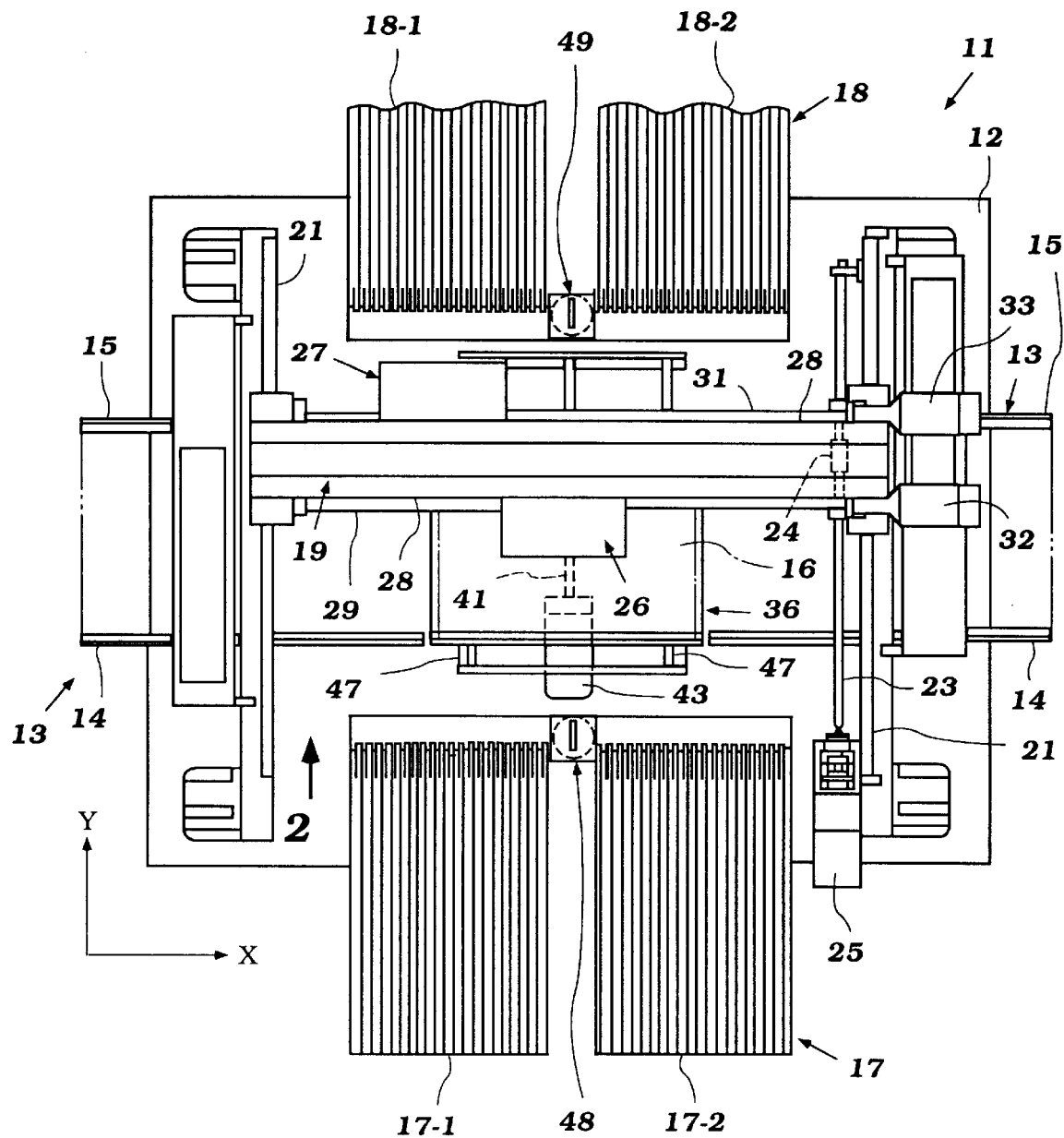
FIG. 1 is a partially schematic, top plan view of a mounting apparatus constructed in accordance with a first embodiment of the invention.

Referring now in detail to the drawings and first to the embodiment of FIGS. 1–4, a mounting apparatus constructed in accordance with this embodiment is indicated generally by the reference numeral 11. The mounting apparatus basically a table assembly 12 that is interposed in the path of a conveyor section, indicated generally by the reference numeral 13. The conveyor section 13 is comprised of a pair of spaced apart belt-type conveyors 14 and 15 that extend, in the illustrated embodiment, in the X axis direction. This conveyor section 13 is adapted to move substrates such as circuit boards, indicated by the reference numeral 16 along a first direction in the X axis path.

Disposed on opposite sides of the conveyor section 13 and specifically the conveyor belts 14 and 15 are a pair of feeder stations 17 and 18. In the illustrated embodiment, the feeder stations 17 and 18 are divided into segments 17-1 and 17-2 and 18-1 and 18-2, respectively. Each of these segments 17-1, 17-2, 18-1, and 18-2 is comprised of a plurality of feeders that are designed to present components of various types and configurations for mounting on the substrates 16. In a preferred embodiment, these feeder segments 17-1, 17-2, 18-1, and 18-2 may be of the tape type. That is, there are provided in each segment a plurality of tape feeders that feed a tape having small pockets in which the individual components are positioned. This type of mechanism is well known in the art and further description of it is not believed to be necessary to permit those skilled in the art to practice the invention.

A carriage assembly, indicated generally by the reference numeral 19, is supported in a manner to be described so as to extend generally in the direction of feed of the substrate 16 by the conveyor mechanism 13. In other words, the carriage assembly 19 extends generally in the X axis direction.

This carriage assembly 19 is mounted for transverse movement relative to the X axis direction, i.e., in the Y axis direction, by means of a pair of spaced apart guide rails 21 that are disposed at opposite sides of the table 12 and transversely or laterally outwardly from the feeder stations 17 and 18. The carriage assembly 19 has bearing arrangements 22 (FIG. 2) that cooperate with the guide rails 21 so as to permit movement in the Y axis direction. The carriage assembly 19 is moved in this direction by an appropriate translational drive assembly. In the illustrated embodiment, this translational drive assembly is comprised of a feed screw 23 that is journaled for rotation by one of the guide rails 21 and which is engaged with a recirculating ball nut 24 fixed in the carriage assembly 19. A servo motor 25 drives the feed screw 23 so as to effect translational movement of the carriage assembly 19 in the Y axis direction. The feed screw 23 and servo drive motor 25 are disposed adjacent one end of the feeder station 17 and 18 and on the table 12.

Mounter head assemblies 26 and 27 are mounted, in a manner to be described, on opposite sides of the carriage assemblies 19 and cooperate with the feeder stations 17 and 18, in a manner which will also be described. The support for the mounter head 26 is shown best in FIG. 2 and a similar mechanism, but reversed, is employed with the mounter head 27.

This mechanism includes a pair of guide rails 28 that are formed on the respective side of the carriage assembly 19 and upon which suitable bearings of the respective mounter head 26 or 27 are slidably supported. A respective feed screw 29 and 31 is also journaled on the respective side of the carriage assembly 19 and cooperates with a recirculating ball nut 30 fixed to the respective mounter head 26 and 27. These feed screws 29 and 31 are driven by respective servo motors 32 and 33 which are, in this embodiment, disposed in side-by-side relationship thereto and at the same end of the mechanism where the servo motor 25 is located.

The feed screws 29 and 31 cooperate with the recirculating ball nuts 30 that are fixed to the mounter heads 26 and 27, respectively, so that rotation of the feed screws 29 and 31 will effect movement of the mounter heads 26 and 27 in the X axis direction and in the direction of feed by the conveyor mechanism 13.

Figure 2:
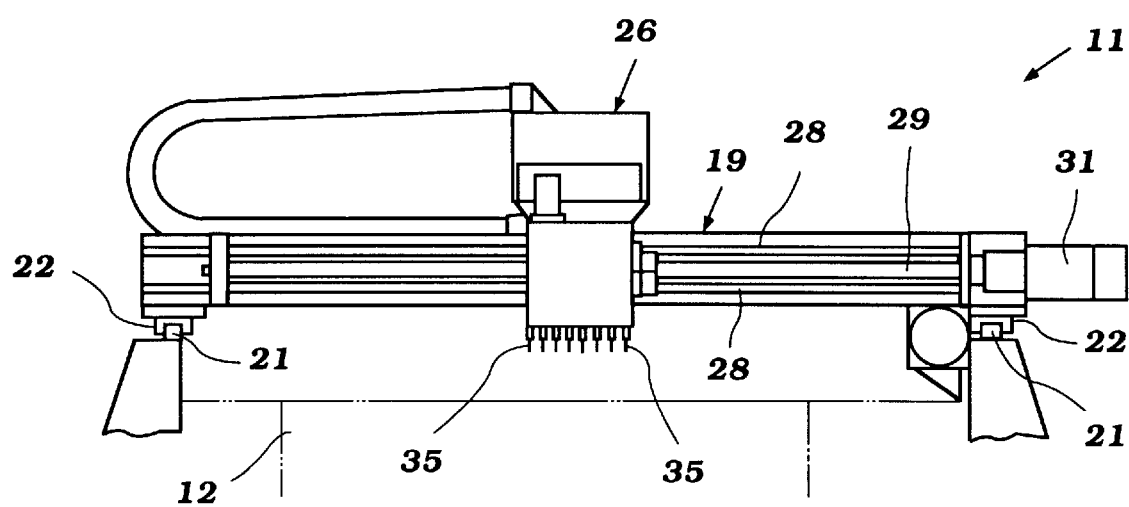
FIG. 2 is a side elevational view looking at one of the mounter heads in the general direction of the arrow 2 in FIG. 1.

As may also be best seen in FIG. 2, each mounter head 26 and 27 carries a plurality of pickup devices 36. The pickup devices 35 may be of any type known in this art such as vacuum nozzles which are connected to a source of reduced pressure so that air pressure will hold small components on these nozzles 35. The pickup nozzles 35 are mounted for vertical movement relative to the respective head assembly 26 or 27 in a Z axis direction as shown in FIG. 2 so that they may be lowered to pickup a component from the respective feeder sections 17 and 18 elevated, moved to a mounting position, and lower so as to mount the component on the substrate 16. These pickup nozzles 35 are also supported for rotation about a rotational axis that extends parallel to the Z axis for angularly orienting these components.

The mechanisms for achieving these rotational and translatory movement in the R and Z axes, respectively, may be of any type well known in this art.

In accordance with the invention, a mechanism is incorporated that permits one of the mounting heads 26 or 27 to be picking up components from its respective feeder section 17 or 18 while the other of the mounting heads is mounting components that have been previously picked up by it on the substrate 16. To achieve this purpose, there is provided a translational conveyor assembly, indicated generally by the reference numeral 36 and which is positioned at an area where there is an interruption in the main conveyor assembly 13. Components are delivered by this main conveyor assembly 13 to the translational conveyor assembly 36 and from the translational conveyor assembly 36 to the next section of the main conveyor 13. This translational conveyor assembly 36 is shown in most detail in FIG. 3 although its components also appear in FIG. 1.

Figure 3:
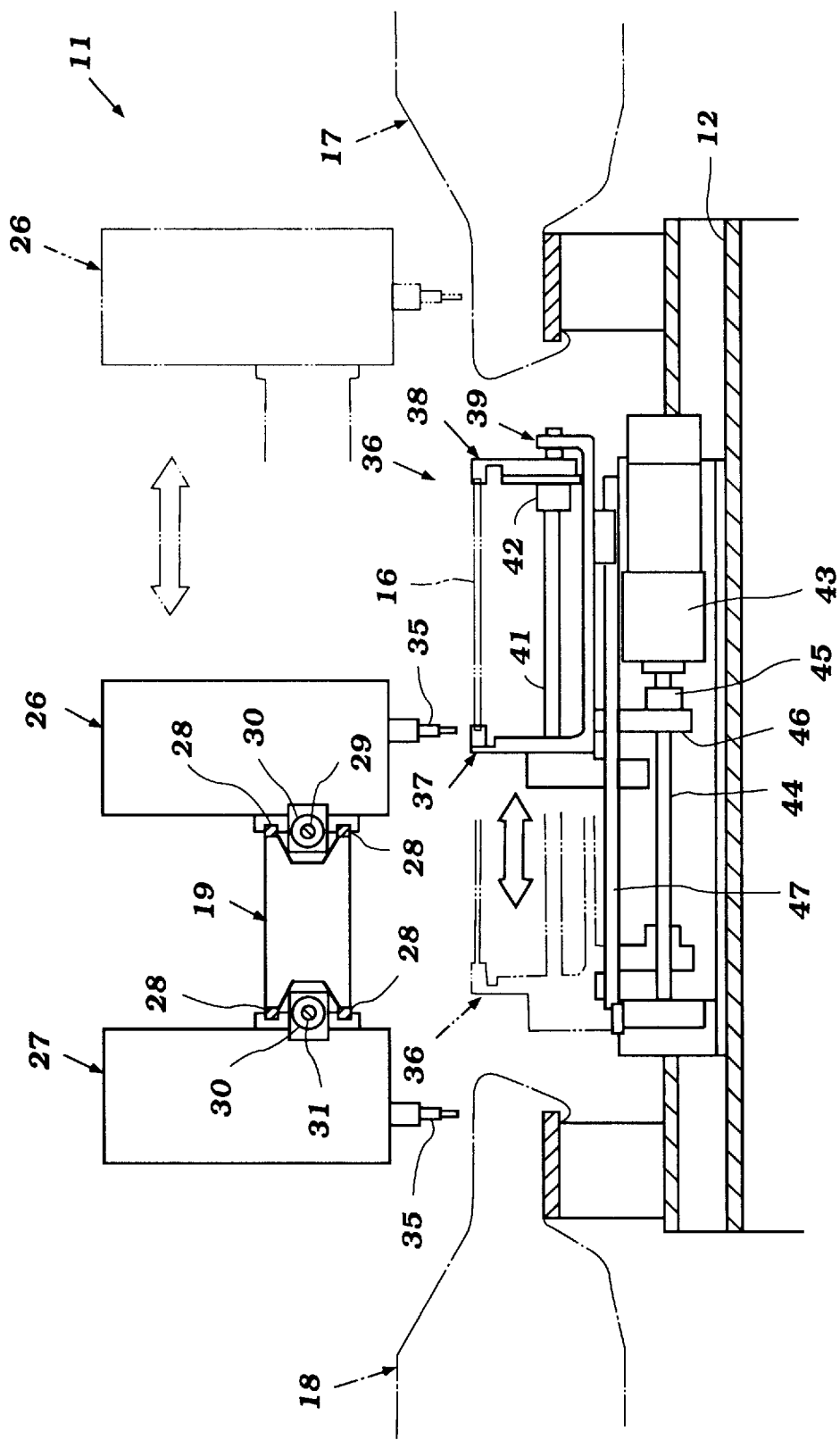
FIG. 3 is a transverse cross-sectional view taken generally along the Y axis as indicated in FIG. 1 in the area between the feeder sections and shows the carriage assembly in a first position in solid lines and a second position in phantom lines, the respective positions of the transfer mechanism for the substrates is also shown in these two positions in the same fashion.
Figure 4:
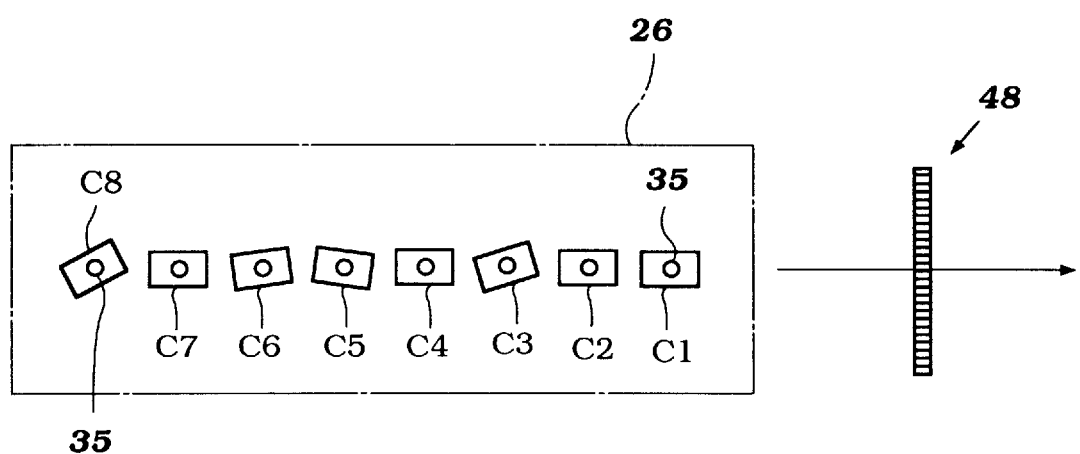
FIG. 4 is a partially schematic view showing how the sensing station cooperates with the various pickup devices to sense the orientation of the components picked up thereby.

Referring primarily to FIG. 3, the translational conveyor 36 includes a pair of conveyor sections 37 and 38 which are belt-type conveyors and are generally aligned with the conveyors 14 and 15. The width of the conveyors 37 and 38 may be appropriately adjusted so as to accommodate different size substrates 16.

A base assembly 39 is provided and one of the conveyors 38 may be fixed on this base 39 while the other conveyor 37 may be adjustable therealong through a screw and nut mechanism comprised of a screw 41 and a nut 42. Also, a clamping mechanism (not shown) may be provided for clamping the substrate 16 on the assembly 36 during the mounting operation.

The table 12 carries a servo motor 43 that drives a feed screw 44. This feed screw 44 is engaged with a recirculating ball nut 45 carried by a depending projection 46 of the frame 39. Guide rails 47 also provide support for the frame assembly 39 so that the frame assembly 39 may be moved from a position closely adjacent the feeder station 17 as shown in solid line view of FIG. 4 or a position closely adjacent the feeder station 18 as shown in the phantom line view of this figure. This proximity permits components to be mounted on the substrate 16 by the mounter head 26 while the mounter head 27 is selecting components from the feeder station 18 as shown in the solid line view.

The Y-axis positioning of the substrate 16 is achieved by operation of the servo motor 43 while the X-axis positioning of the mounter head 26 is achieved by the servo motor 32, as previously noted. Alternatively, when the substrate or circuit board 16 is moved to the phantom line position shown in FIG. 3, components may be mounted from the mounter head 26 while components are selected from the feeder station 17 by the mounter head 26.

Finally, the apparatus includes a pair of sensors, indicated by the reference numerals 48 and 49 which are mounted on the table 12. The sensor 48 is provided between the feeder station segments 17-1 and 17-2. The sensor 49 is mounted between the feeder stations segments 18-1 and 18-2. Thus, in addition to picking up components from the feeder stations 17 and 18, respectively, by the mounter heads 26 and 27, the mounter heads 26 and 27 may be moved along the sensor stations 48 and 49 in the X axis direction so that the individual components indicated at C1, C2, C3, C4, C5, C6, C7, and C8 picked up by the individual pickup devices 36 may be appropriately sensed so that their correct orientation can be determined. Appropriate corrections can then be made in the subsequent mounting procedure.

Thus, the system operates in the following manner. A substrate 16 is moved onto the translational conveyor 36. At this time, one of the mounter heads 26 or 27 will have been positioned over its respective feeder station 17 or 18 and a plurality of components such as the components C1 through C8 will have been picked up and sensed by the respective sensor station 48 or 49. Thus, when the circuit board 16 is moved into the transitional conveyor 36 and locked in place by the aforenoted clamping mechanism, the carriage assembly 19 may be moved so that the mounter head 27 is positioned in registry with the feeder station 18 and it may pick up fresh components to replace those which have been previously deposited on a finished circuit board 16.

During this time, components now picked up by the head 26 can be positioned on the circuit board by manipulating the feed screw 32 to select the X axis direction and by operating the servo motor 43 to select the Y axis location. As may be seen by comparing the solid and phantom line views of the circuit board 16 in FIG. 3, it will be apparent that the full range of access of the circuit board will be available to the mounter head 26 without interfering with the ability of the mounter head 27 to be able to pick up components.

Once the mounting on the board 16 by the head 26 has been completed and the head 27 has picked up its necessary components, the circuit board 16 is advanced out of the station by the conveyor 13. A new circuit board is then presented to the transitional conveyor 36 by the conveyor 13.

When the new board is in place, the carriage 19 is shifted from the solid line position shown in FIG. 3 to the phantom line position shown in this figure. At this time, the mounter head 26 may then pick up new components to replace those previously deposited and the head 27 may mount its components on the new board in a manner like that previously described. That is, the feed screw 33 can move carriage 27 in the X axis direction independently of the simultaneous movement of the carriage 26 in this direction by its servo motor 32. Y axis positioning of the component is controlled by the transitional motion of the transitional conveyor 36.

Figure 5:
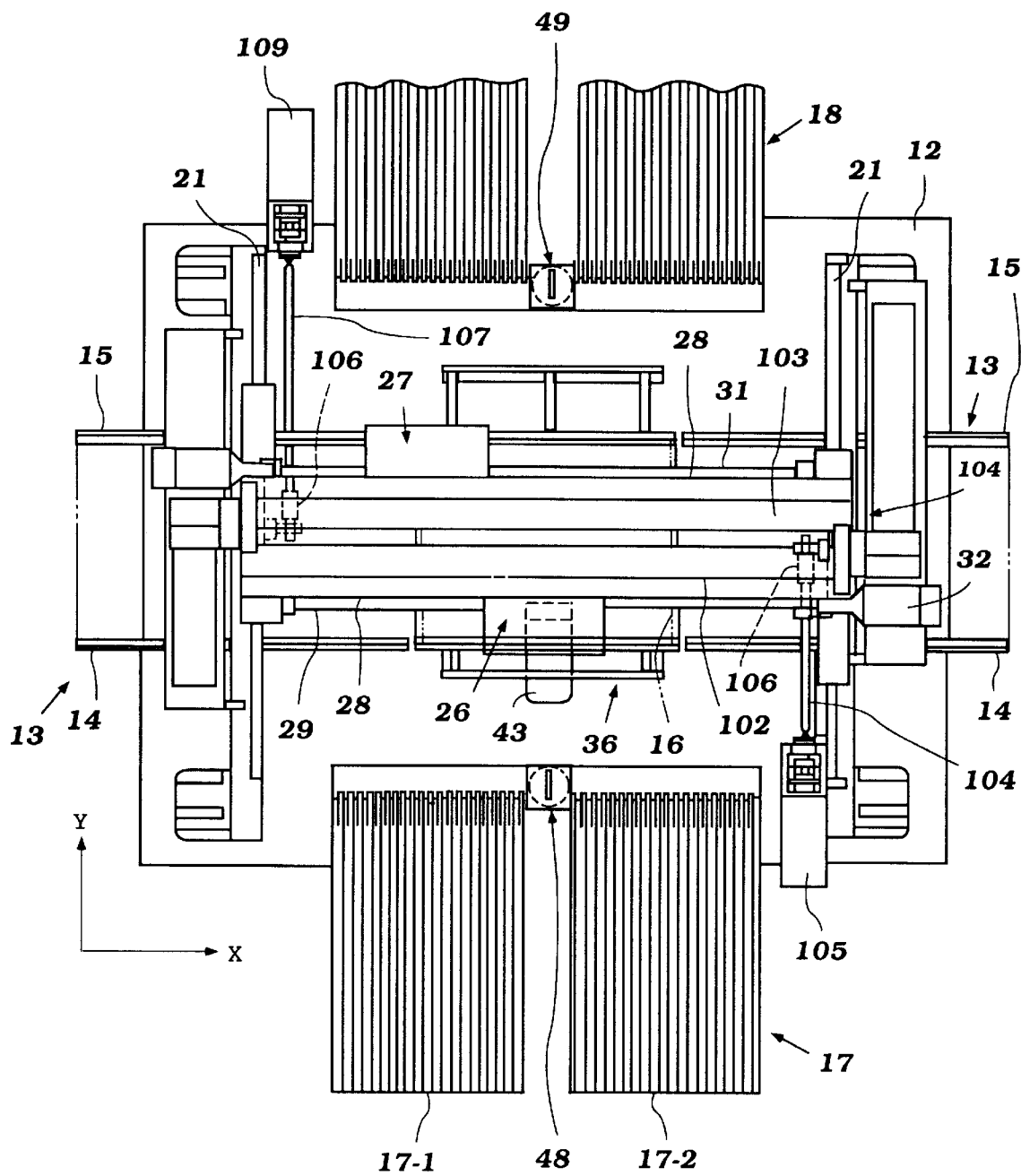
FIG. 5 is a top plan view, in part similar to FIG. 1, and shows a second embodiment of the invention.

FIG. 5 shows another embodiment of the invention which is basically the same as the embodiment of FIGS. 1–4. However, this embodiment is somewhat different in that the mounting heads 26 and 27 are each mounted on a separate section of a carriage assembly, which carriage assembly is indicated generally by the reference numeral 101. This combined carriage assembly 101 includes a first carriage 102 that carries the mounting head 26 in the manner previously described. A second carriage 103 carries the mounting head 27.

Because of this separate mounting, the carriage 102 is operated by a feed screw 104 driven by a servo motor 105 at one end of the carriage assembly 101. This feed screw 104 cooperates with a recirculating ball nut 106 so as to achieve Y axis motion of the mounting head 26.

In a similar manner, a feed screw 107 cooperates with a ball nut 108 of the carriage 103. The feed screw 107 is driven by a servo motor 109 so as to control the Y axis position of the carriage 103.

Therefore, this mechanism has some features in common with the described prior art construction. However, in this embodiment and with this construction the likelihood of interference is avoided because of the provision of the translational carriage assembly 36 which operates with the respective mounting head 26 or 27 for positioning of the components on the substrate 16 in the manner previously described. When this mounting is taking place, the remaining carriage is picking up components from its respective feeder section station 17 or 18. Thus, the sequence of operation of this embodiment is the same as that previously described except for the aforenoted differences. Some of the Y axis control for the components mounted may take place utilizing the respective Y axis servo motors 105 and 109. However, the interference and operation is specifically improved because of the use of the translational mechanism 36 which can provide the bulk of the location function.

With this mechanism, it is also possible to first mount components on the board from the mounting head 26 and then subsequently mount additional components from the head 27. In this arrangement, however, the heads 26 and 27 have different operational positions and this is accommodated for by use of the translational conveyor 36 so as to avoid any interference between the two carriages 102 and 103. That is, each carriage has a fixed range of movement and within this range the translational conveyor 36 can place the board 16 so that its full surface can be accommodated by the one head while the remaining head can move through its full range of movement without contact. Thus, no complicated mechanism is required which would avoid collision and each head may be operating at all the time without any pause.

Thus, from the foregoing description it should be readily apparent that the described embodiments of the invention permit rapid utilization of all parts of the apparatus without one part having to wait for another part to finish its operation. Of course, the foregoing description is that of the preferred embodiments of the invention and various changes and modifications may be made without departing from the spirit and scope of the invention, as defined by the appended claims.

What is claimed is:

1. A surface mounting apparatus for mounting components on a substrate comprised of a conveyor section for transferring substrates along a path extending in a first direction, a pair of feeder stations for supplying a plurality of components, each of said feeder stations being disposed on a respective opposite side of said path, a carriage assembly extending generally in said first direction along said path and between said feeder stations, said carriage assembly carrying a pair of mounting heads on opposite sides thereof, each of said mounting heads including at least one pickup device for picking up a component from the feeder station at the respective side of said conveyor section, said mounting heads being supported for movement relative to each other and to said carriage assembly in the first direction, and a single translational means positioned transversely between said feeder stations for moving a substrate transversely to the path of said conveyor section between said feeder stations so that one of said mounter heads is placing the picked up component on said substrate while the other of said mounter heads is simultaneously picking up another component from the respective feeder station for subsequent deposit on the same substrate on the single translational means.

2. The surface mounting apparatus as set forth in claim 1, wherein the mounter heads are mounted for movement only in the first direction relative to the carriage assembly.

3. The surface mounting apparatus as set forth in claim 2, wherein the carriage assembly comprises a single carriage with each mounter head being mounted on an opposite side thereof.

4. The surface mounting apparatus as set forth in claim 3, further including a pair of servo motors for moving the respective mounter heads in the first direction along the single carriage assembly.

5. The surface mounting apparatus as set forth in claim 1, wherein at least one of the mounter heads is movable relative to the other mounter head in a direction transverse to the first direction.

6. The surface mounting apparatus as set forth in claim 5, wherein each mounter head is movable relative to the carriage assembly and the other mounter head transverse to the first direction.

7. The surface mounting apparatus as set forth in claim 6, wherein the carriage assembly comprises a pair of carriages each carrying a respective mounter head at one side thereof.

8. The surface mounting apparatus as set forth in claim 7, wherein the path of movement of each of the carriages is limited so that the paths of movement of the carriages do not overlap each other in the transverse direction.

9. The surface mounting apparatus as set forth in claim 1, wherein each feeder station comprises a plurality of feeder assemblies.

10. The surface mounting apparatus as set forth in claim 9, further including a pair of sensors each disposed at a respective one of the feeder stations.

11. The surface mounting apparatus as set forth in claim 10, wherein each mounter head is movable relative to the feeder station for presenting a component carried thereby to the sensor.

12. The surface mounting apparatus as set forth in claim 11, wherein there are a plurality of pickup devices carried by each mounter head.

13. The surface mounting apparatus as set forth in claim 12, wherein each pickup device is rotational about an axis that extends normal to the first direction and the transverse direction and reciprocal along an axis that extends perpendicularly to a plane defined by the first and transverse directions.

* * * * *